(12) United States Patent
Lee

(10) Patent No.: US 7,447,105 B2
(45) Date of Patent: Nov. 4, 2008

(54) MEMORY ROW DECODER

(75) Inventor: Cheng-Sheng Lee, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 203 days.

(21) Appl. No.: 11/586,665

(22) Filed: Oct. 26, 2006

(65) Prior Publication Data

US 2008/0101148 A1     May 1, 2008

(51) Int. Cl.
*G11C 8/00* (2006.01)
(52) U.S. Cl. ............................ 365/230.06; 365/189.09
(58) Field of Classification Search ............ 365/230.06, 365/189.09, 189.11
See application file for complete search history.

(56) References Cited

U.S. PATENT DOCUMENTS 5,365,479 A  * 11/1994 Hoang et al. ............ 365/189.09
5,563,842 A  * 10/1996 Challa ................... 365/230.06
5,636,175 A  *  6/1997 McLaury ................ 365/230.06
7,277,315 B2 * 10/2007 Yuan et al. .................. 365/149

* cited by examiner

*Primary Examiner*—Anh Phung
(74) *Attorney, Agent, or Firm*—Muncy, Geissler, Olds & Lowe, PLLC

(57) ABSTRACT

A memory row decoder is disclosed, comprising a first depletion NMOS transistor having a second source/drain coupled to a first partially decoded signal, and a gate coupled to a second partially decoded signal, a first enhancement PMOS transistor having a second source/drain coupled to the second partially decoded signal, and a gate coupled to a first source/drain of the first depletion NMOS transistor, a first enhancement NMOS transistor having a first source/drain coupled to a first source/drain of the first enhancement PMOS transistor, a second source/drain coupled to a first reference potential, and a gate coupled to the first partially decoded signal, and a second enhancement NMOS transistor having a first source/drain coupled to the first source/drain of the first enhancement PMOS transistor, a second source/drain coupled to the first reference potential, and a gate coupled to a reset signal. The first enhancement PMOS transistor has reduced GIDL current and thus the memory row decoder consumes less power in an unselected mode.

2 Claims, 4 Drawing Sheets

MEMORY ROW DECODER

BACKGROUND OF THE INVENTION

1. Field of the Invention

The invention relates to a memory row decoder and more particularly to a memory row decoder with reduced gate induced drain leakage (GIDL) current.

2. Description of the Related Art

Gate induced drain leakage (GIDL), with regards to off-state current, constitutes a serious constraint in scaled down CMOS device. GIDL is induced by strong electric field between the gate and drain, and increases exponentially due to reduced gate oxide thickness. Since increased integration of semiconductor devices requires thinner gate oxide layer between a substrate and gate, GIDL is an issue when MOS transistors are scaled towards the deep sub-micrometer regime.

FIG. 1 is an exemplary diagram showing source-to-drain current ISD as a function of source-to-gate voltage VSG for a PMOS transistor, to illustrate GIDL effect. As shown, when source-to-gate voltage VSG for the PMOS transistor falls below threshold voltage Vt, only sub-threshold current flows in the source-to-drain path. This current decreases with VSG down to −VA. The value of −VA may range from −1V to −3V, dependent on fabrication technology and process. However, if the source-to-gate voltage VSG is more negative than −VA, a leakage current (GIDL) occurs and increases significantly with decreased VSG. It is noted the drawing and discussion here are for a PMOS transistor, and can be analogized to NMOS by replacing the source-to-drain current ISD with drain-to-source current IDS and source-to-gate voltage VSG with gate-to-source voltage VGS.

FIG. 2 is a schematic diagram of a conventional memory row decoder 200, to which one of word lines of a memory can be coupled and enabled selectively. As shown, the memory row decoder driver 200 includes an enhancement PMOS transistor, mep1, having its source-to-drain path coupled between a signal terminal 21 and an output terminal 23 to which is coupled the associated word line WL of the memory row decoder 200. The substrate 22 of mep1 is coupled to a terminal 24 to which is applied a fixed potential VPP. The source-to-drain paths of enhancement NMOS transistors men1 and men2 are coupled in parallel between the output terminal 23 and a terminal 25 to which is applied another fixed potential VNN relatively negative to VPP. The substrates 26 and 27 of transistors men1 and men2 are also returned to VNN. A first partially decoded signal, bMWL, is applied to the gates of transistors mep1 and men1 and a second partially decoded signal, WLDV, is applied to the signal terminal 21. A reset signal WLRST (typically the inverse of WLDV) is applied to the gate of men2 to enable the word line WL to be selectively clamped to VNN for certain input signal conditions.

The circuit of FIG. 2 is used to activate a selected word line. When the first partially decoded signal bMWL is low and the second partially decoded signal WLDV is high (and the reset signal WLRST is low), a high potential (e.g., VPP) is applied to the word line, activating it and enabling the memory cell transistors with gates coupled to the word line. The memory row decoder 200 is accordingly deemed to operate in a "selected" mode. When the first partially decoded signal bMWL is high and the second partially decoded signal WLDV is a low (and WLRST is high), a low potential (e.g., VNN) is applied to the word line WL and the memory row decoder 200 is deemed to operate at an "unselected" mode since the memory cell transistors with gates coupled to the word line are turned off. Thus, the memory row decoder 200 may be used to apply either an activation voltage (e.g., VPP) to the word line WL or a deactivation voltage (e.g., VNN) to the word line WL.

As shown, when the memory row decoder 200 is in an unselected mode, the source-to-gate voltage of the enhancement PMOS transistor mep1 is (VNN-VPP). In memory design, the level of VNN is chosen relatively negative to the bulk voltage of other transistors outside the memory for the purpose of minimizing the off-state sub-threshold current of the transistors in the memory. However, this makes (VNN-VPP) more negative and results in increased off-state sub-threshold current due to GIDL effect and accordingly more power consumption.

It is thus important to provide a memory row decoder with reduced GIDL current to reduce power consumption.

BRIEF SUMMARY OF THE INVENTION

The invention discloses a memory row decoder with reduced GIDL current when operating in an unselected mode, with reduced power consumption.

The invention provides a memory row decoder comprising a first depletion NMOS transistor having a first source/drain, a second source/drain coupled to a first partially decoded signal, and a gate coupled to a second partially decoded signal, a first enhancement PMOS transistor having a first source/drain, a second source/drain coupled to the second partially decoded signal, and a gate coupled to the first source/drain of the first depletion NMOS transistor, a first enhancement NMOS transistor having a first source/drain coupled to the first source/drain of the first enhancement PMOS transistor, a second source/drain coupled to a first reference potential, and a gate coupled to the first partially decoded signal, and a second enhancement NMOS transistor having a first source/drain coupled to the first source/drain of the first PMOS transistor, a second source/drain coupled to the first reference potential, and a gate coupled to a reset signal. The first source/drain of the first enhancement PMOS transistor acts as an output terminal of the memory row decoder to be coupled to a word line of a memory.

Since the gate voltage of the first enhancement PMOS transistor is reduced when the memory row decoder is in an unselected mode to deactivate the word line, the GIDL current in the first enhancement PMOS is reduced, and accordingly the memory row decoder consumes less power and provides enhanced power efficiency.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
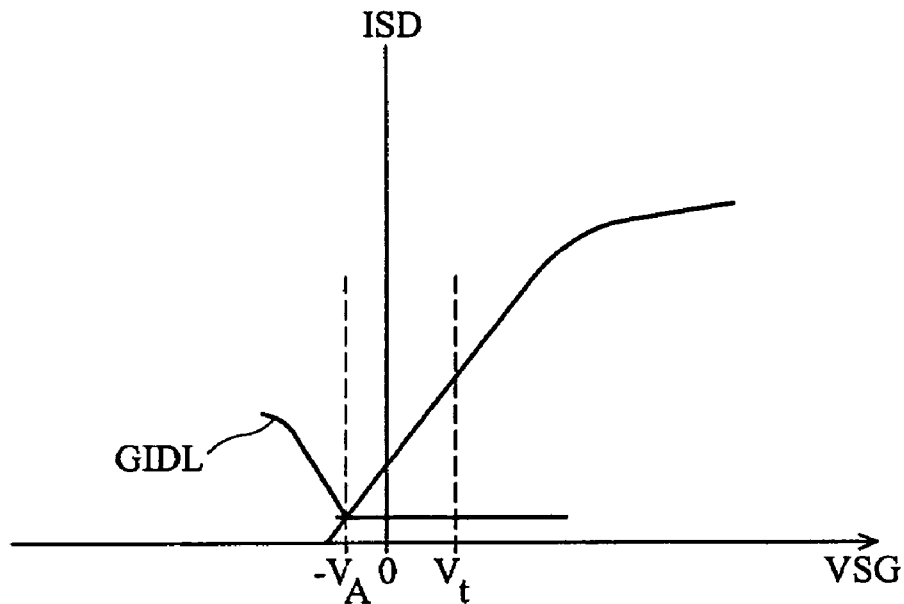
FIG. 1 is an exemplary diagram showing source-to-drain current in the main conduction path of a transistor as a function of gate-to-source voltage (for a NMOS transistor) or source to gate voltage (for a PMOS transistor).
Figure 2:
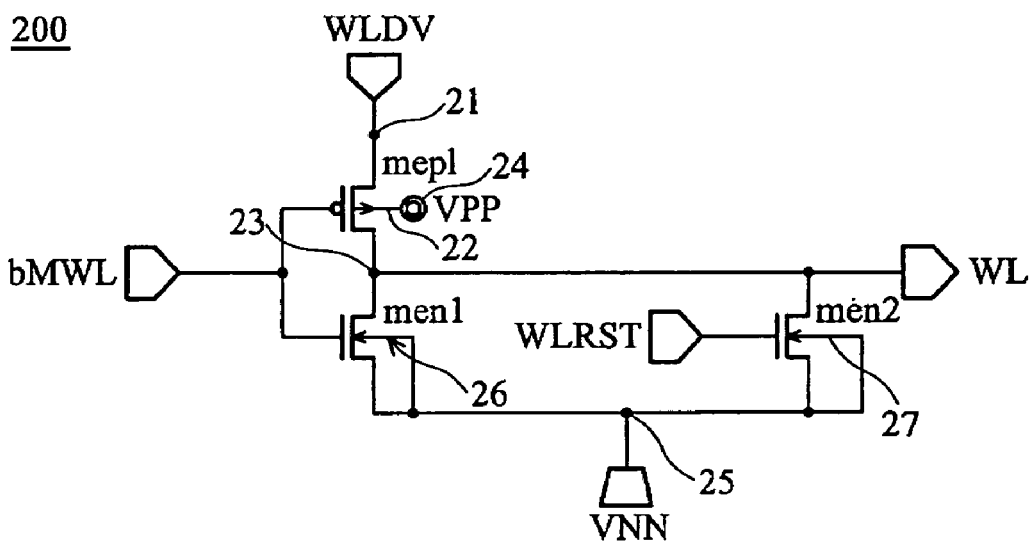
FIG. 2 is a schematic diagram of a conventional memory row decoder.
Figure 3:
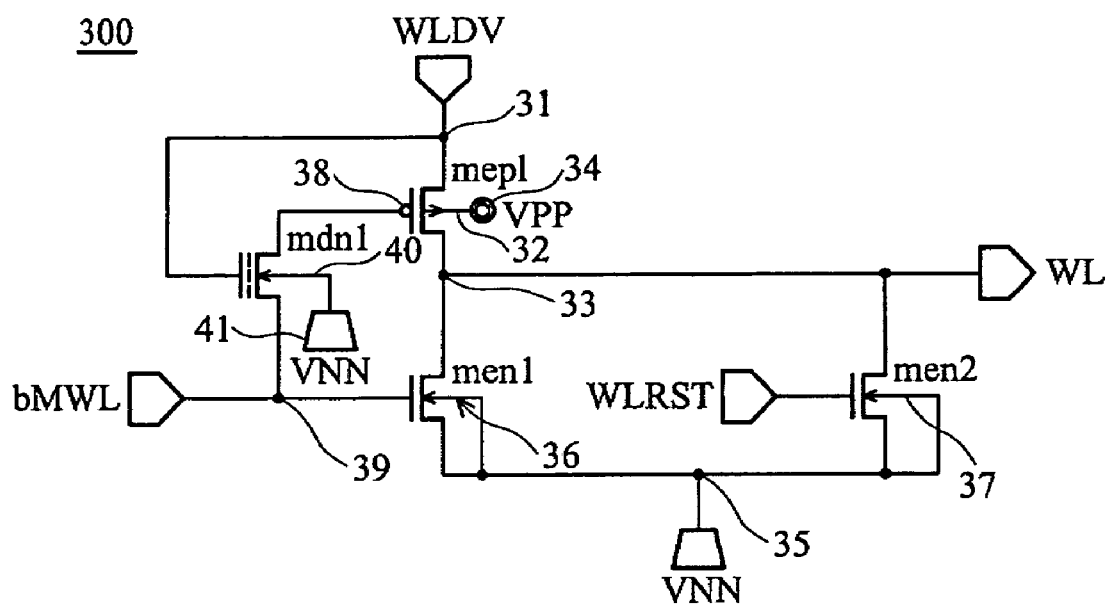
FIG. 3 is a schematic diagram of a memory row decoder in accordance with an embodiment of the invention.

FIG. 3 is a schematic diagram of a memory row decoder 300 in accordance with an embodiment of the invention. The memory row decoder driver 300 includes an enhancement PMOS transistor, mep1, having source-to-drain path coupled between a signal terminal 31 and an output terminal 33 to which is coupled a word line WL associated with the memory row decoder 300. The substrate 32 of the enhancement PMOS transistor mep1 is coupled to a terminal 34 to which is applied a second reference potential VPP. A depletion NMOS transistor, mdn1, having source-to drain path coupled between the gate 38 of the enhancement PMOS transistor mep1 and a signal terminal 39. The depletion NMOS transistor mdn1 has a substrate 40 coupled to a terminal 41 to which is applied a first reference potential VNN and a gate coupled to the signal terminal 31. The source-to-drain paths of enhancement NMOS transistors men1 and men2 are coupled in parallel between the output terminal 33, which is coupled to the word line WL, and a terminal 35 to which is applied the first reference potential VNN. The substrates 36 and 37 of the enhancement transistors men1 and men2 are also returned to the first reference potential VNN. A first partially decoded signal, bMWL, is applied to the signal terminal 39 and a second partially decoded signal, WLDV, is applied to the signal terminal 31. A reset signal WLRST (typically the inverse of WLDV) is applied to the gate of the second enhancement NMOS transistor men2 to enable the word line WL to be selectively clamped to VNN for certain input signal conditions. It is shown clearly that the only difference between the memory row decoders 200 and 300 of FIGS. 2 and 3 is addition of the depletion MOS transistor mdn1 to the memory row decoder 300, lowering the voltage at the gate 38 of enhancement PMOS transistor mep1, further reducing the GIDL current for the enhancement PMOS transistor mep1 when the memory row decoder 300 operates in an unselected mode, described in detail as follows.

Figure 4:
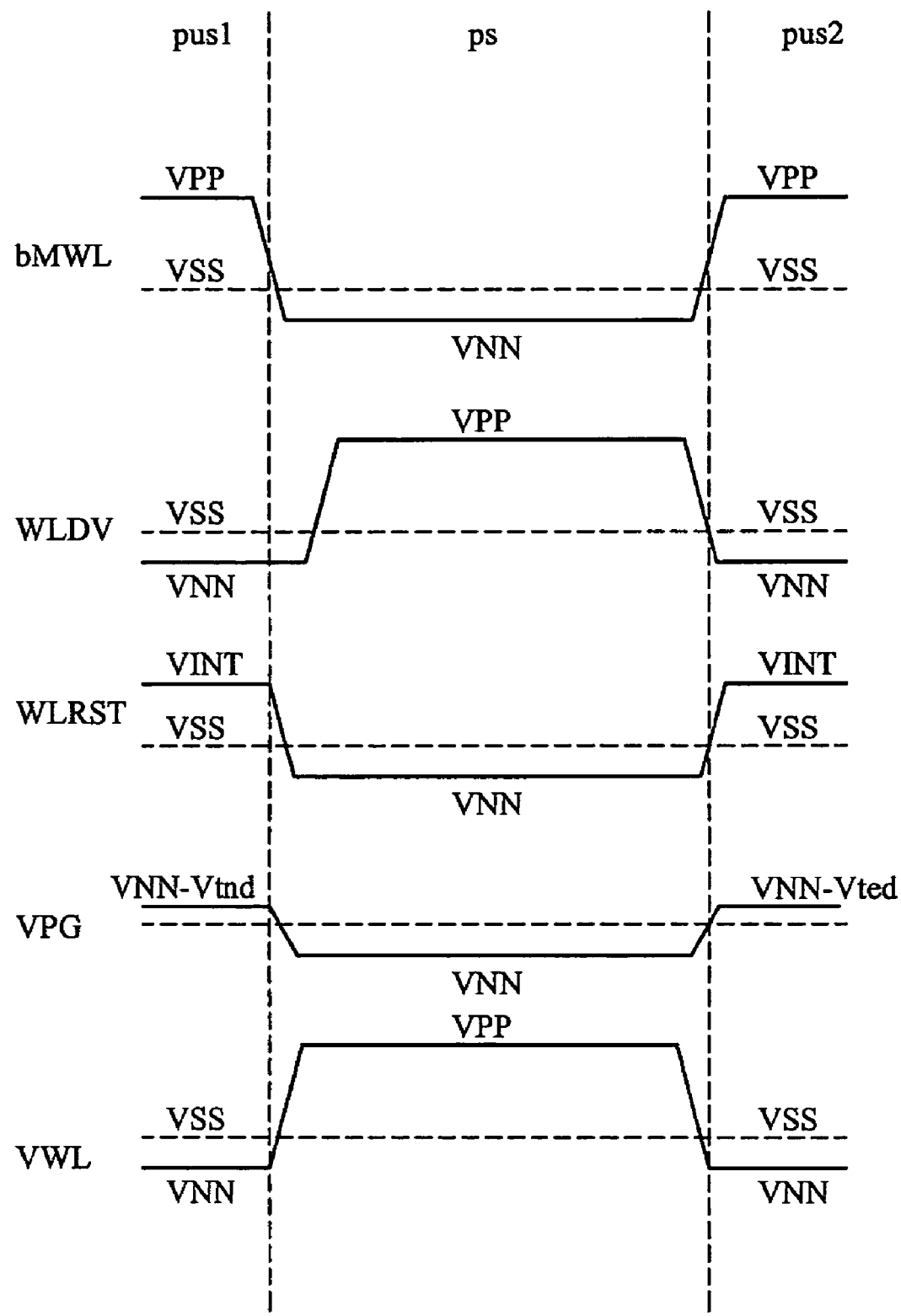
FIG. 4 is a exemplary timing diagram showing waveforms of first and second partially decoded signals, reset signal, and voltages at the gate of enhancement PMOS transistor and output terminal in the memory row decoder of FIG. 3.

FIG. 4 is a exemplary timing diagram showing waveforms of the first and second partially decoded signal bMWL and WLDV, the reset signal WLRST, the voltage VPG at the signal terminal 38, and the voltage VWL at the output terminal 33 (or the word line WL). In periods Pus1 or Pus2, the first partially decoded signal bMWL is high (at level VPP), the second partially decoded signal WLDV is a low (at level VNN), and WLRST is high (at level VINT). Referring to FIG. 3, in the depletion NMOS transistor mdn1, since bMWL is higher than WLDV, a transient current flows from signal terminal 39 to the signal terminal 38, charging the gate 38 of the enhancement PMOS transistor mep1. Simultaneously, the enhancement PMOS transistor mep1 is turned off since it has negative source-to-gate voltage. Further, the high bMWL and WLRST turn on the enhancement NMOS transistors men1 and men2 respectively, pulling down the voltage VWL at the output terminal 33 to VNN. Since a low potential VNN is applied to the word line WL, the memory cell transistors with gates coupled to the word line WL are turned off and the memory row decoder 300 is deemed to operate in an "unselected" mode.

The transient current flows until voltage VPG at the gate 38 of the enhancement PMOS transistor mep1 is charged to (VNN-Vtnd) so as to turn off the depletion NMOS transistor mdn1, wherein Vtnd denotes threshold voltage of the depletion transistor NMOS transistor mdn1. The enhancement PMOS transistor mep1 stays turned off and its source-to-gate voltage is stabilized at [VNN−(VNN−Vtnd)]=Vtnd.

Figure 5:
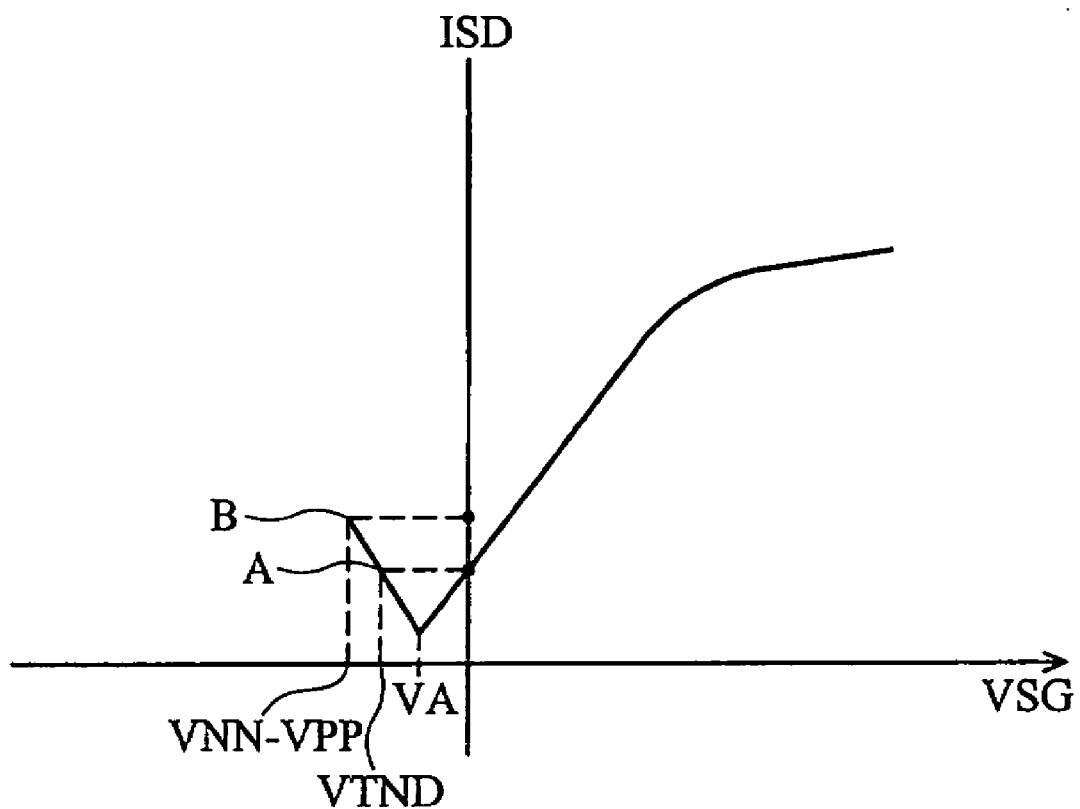
FIG. 5 is an exemplary diagram showing source-to-drain current as a function of source-to-gate voltage of the PMOS transistor mep1 in FIGS. 2 and 3.

FIG. 5 is an exemplary diagram showing the source-to-drain current ISD as a function of source-to-gate voltage VSG of the enhancement PMOS transistor mep1 in FIGS. 2 and 3, to illustrate GIDL effect when the memory row decoder 200 and 300 operates in an unselected mode. For the memory row decoder 300, the source-to-gate voltage VSG of the enhancement PMOS transistor mep1 is Vtnd, as is indicated by "A". For the memory row decoder 200, the source-to-gate voltage VSG of the enhancement PMOS transistor mep1 is (VNN−VPP), as is indicated by "B". Since Vtnd is more positive than (VNN−VPP), GIDL current associated with the memory row decoder 300 is less than that associated with the memory row decoder 200. Accordingly, the memory row decoder 300 consumes less power and has better power efficiency than the memory row decoder 200. Preferably, threshold voltage Vtnd of the depletion NMOS transistor mdn1 is chosen to approximate to −VA such that enhancement PMOS transistor mep1 has a minimum value of off-state current.

Next, in a period Ps, the first partially decoded signal bMWL is turned to low (at level VNN), the signal WLDV is a turned to high (at level VPP), and WLRST is turned to low (at level VNN). The low bMWL and WLRST turn off the NMOS transistors men1 and men2. Further, since bMWL is low and WLDV is high, the depletion NMOS transistor mdn1 is turned on, pulling the voltage VPG at the signal terminal 38 down to VNN, turning on the enhancement PMOS transistor mep1. Resultingly, the voltage VWL at the output terminal 33 is pulled up to VPP.

Since a high potential VPP is applied to the word line WL, activation thereof and enabling the memory cell transistors with gates coupled to the word line WL, the memory row decoder 300 is deemed to operate at a "selected" mode.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory row decoder, comprising:
   a first depletion NMOS transistor having a first source/drain, a second source/drain coupled to a first partially decoded signal, and a gate coupled to a second partially decoded signal;
   a first enhancement PMOS transistor having a first source/drain, a second source/drain coupled to the second partially decoded signal, and a gate coupled to the first source/drain of the first depletion NMOS transistor;
   a first enhancement NMOS transistor having a first source/drain coupled to the first source/drain of the first enhancement PMOS transistor, a second source/drain coupled to a first reference voltage, and a gate coupled to the first partially decoded signal; and
   a second enhancement NMOS transistor having a first source/drain coupled to the first source/drain of the first enhancement PMOS transistor, a second source/drain coupled to the first reference voltage, and a gate coupled to a reset signal,
   wherein the first source/drain of the first enhancement PMOS transistor acts as an output terminal of the row decoder to connect to a word line of a memory.

2. The memory row decoder of claim 1, wherein the substrate of the first enhancement PMOS transistor is coupled to a second reference potential equal to the high level of the second partially decoded signal, and the substrates of the first depletion NMOS transistor, the first and second enhancement NMOS transistors are all coupled to the first reference potential.

* * * * *